United States Patent [19]
Staskus et al.

[11] Patent Number: 5,923,692
[45] Date of Patent: *Jul. 13, 1999

[54] NO WIRE BOND PLATE (NWBP) PACKAGING ARCHITECTURE FOR TWO DIMENSIONAL STACKED DIODE LASER ARRAYS

[75] Inventors: Michael P. Staskus, Saratoga; James M. Haden, San Jose; John G. Endriz, Belmont, all of Calif.

[73] Assignee: SDL, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/736,254

[22] Filed: Oct. 24, 1996

[51] Int. Cl.$^6$ .................................................. H01S 3/19
[52] U.S. Cl. .............................. 372/50; 372/36; 372/34
[58] Field of Search .................... 372/50, 36, 34

[56] References Cited

U.S. PATENT DOCUMENTS

| | | | |
|---|---|---|---|
| 4,454,602 | 6/1984 | Smith | 372/36 |
| 4,716,568 | 12/1987 | Scifres et al. | 372/36 |
| 5,099,488 | 3/1992 | Ahrabi et al. | 372/361 |
| 5,305,344 | 4/1994 | Patel | 372/50 |
| 5,325,384 | 6/1994 | Herb et al. | 372/36 |
| 5,394,426 | 2/1995 | Joslin | 372/50 |
| 5,438,580 | 8/1995 | Patel et al. | 372/36 |
| 5,495,490 | 2/1996 | Rice et al. | 372/34 |
| 5,627,850 | 5/1997 | Irwin et al. | 372/50 |
| 5,636,234 | 6/1997 | Takagi | 372/50 |
| 5,652,763 | 7/1997 | Delfyett, Jr. | 372/36 |

*Primary Examiner*—Rodney Bovernick
*Assistant Examiner*—Yisun Song
*Attorney, Agent, or Firm*—W. Douglas Carothers, Jr.

[57] ABSTRACT

A high-power two-dimensional edge-emitting diode laser array comprises mounting modules, laser bars mounted on the modules, and protective caps mounted on the bars opposite the modules. The lasers are electrically connected in series through the modules and caps. The caps serve as laser bar protectors during the bar burn-in. The caps have grooves which compensate for tolerances in the thicknesses of the lasers, modules, and caps. The array is mounted on a base plate, and is in thermal communication with a heat sink. The caps and/or modules are thermal-expansion-matched to the laser bars. Eliminating the need for a wire bond plate allows shortening the modules.

55 Claims, 5 Drawing Sheets

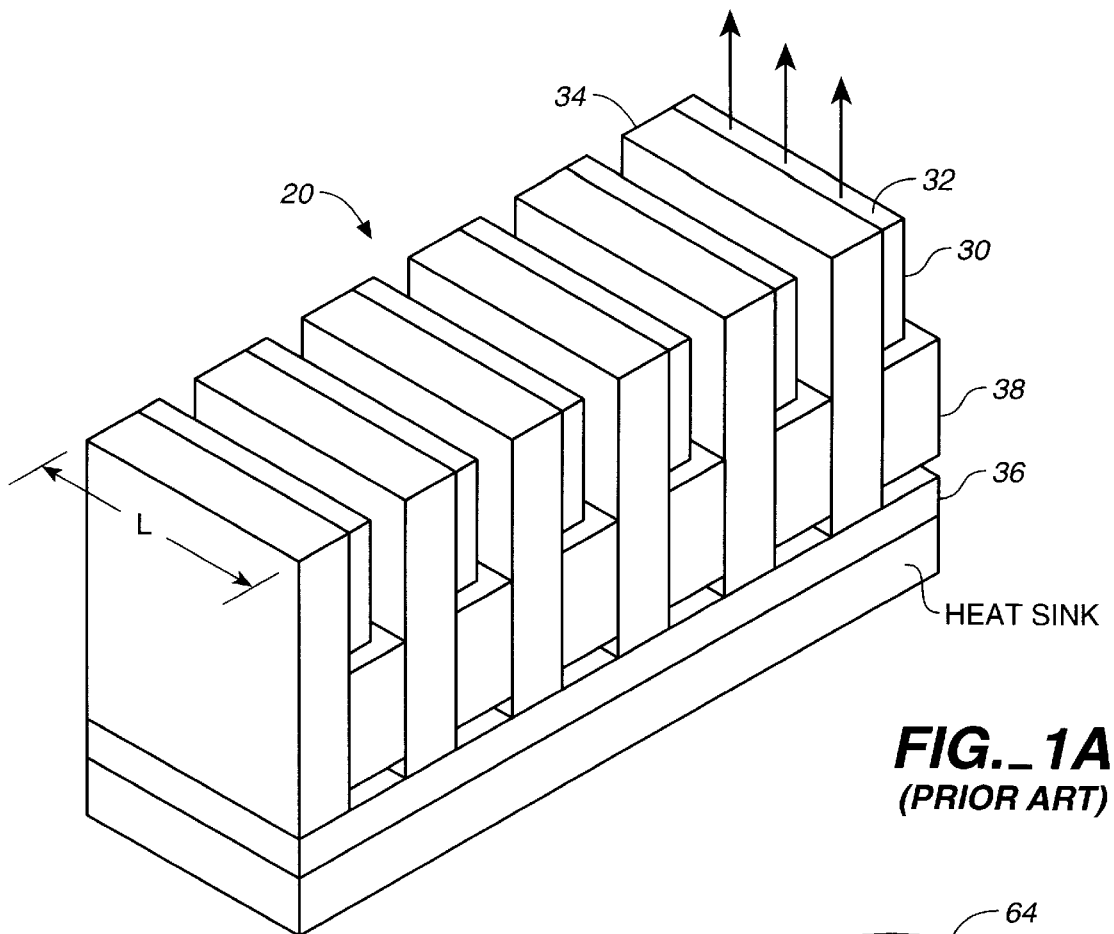
FIG._1A
(PRIOR ART)
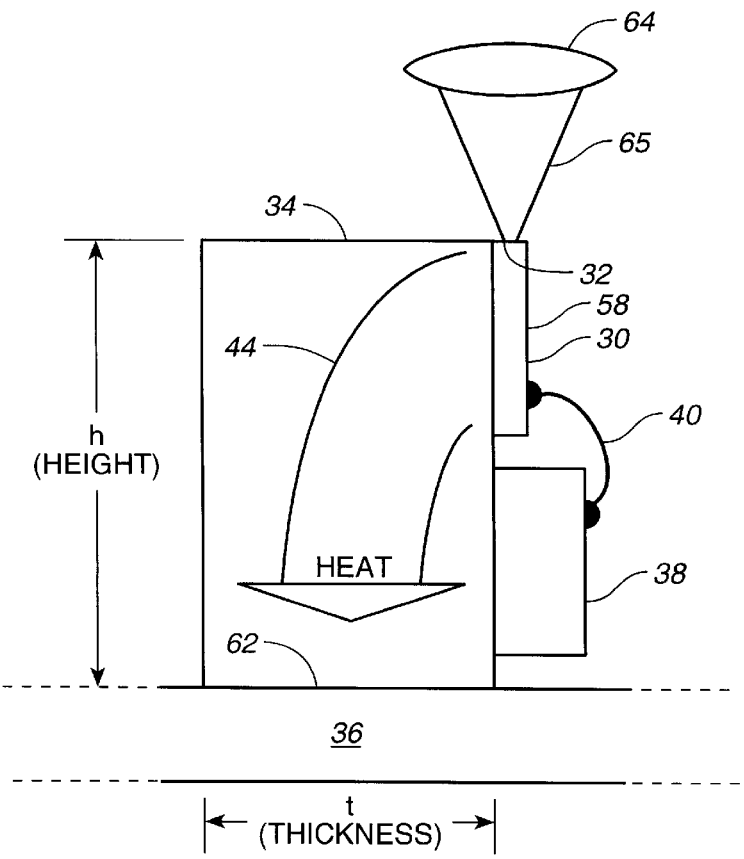
FIG._1B
(PRIOR ART)

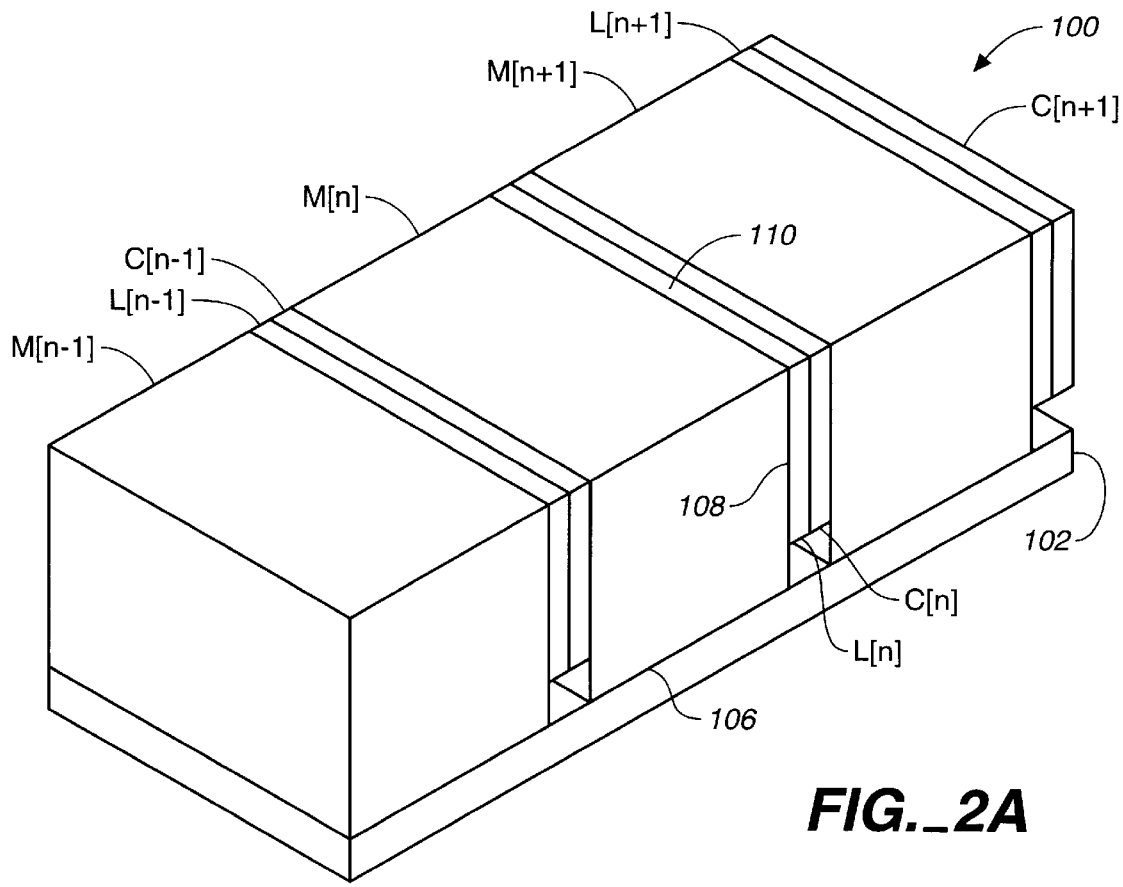
FIG._2A
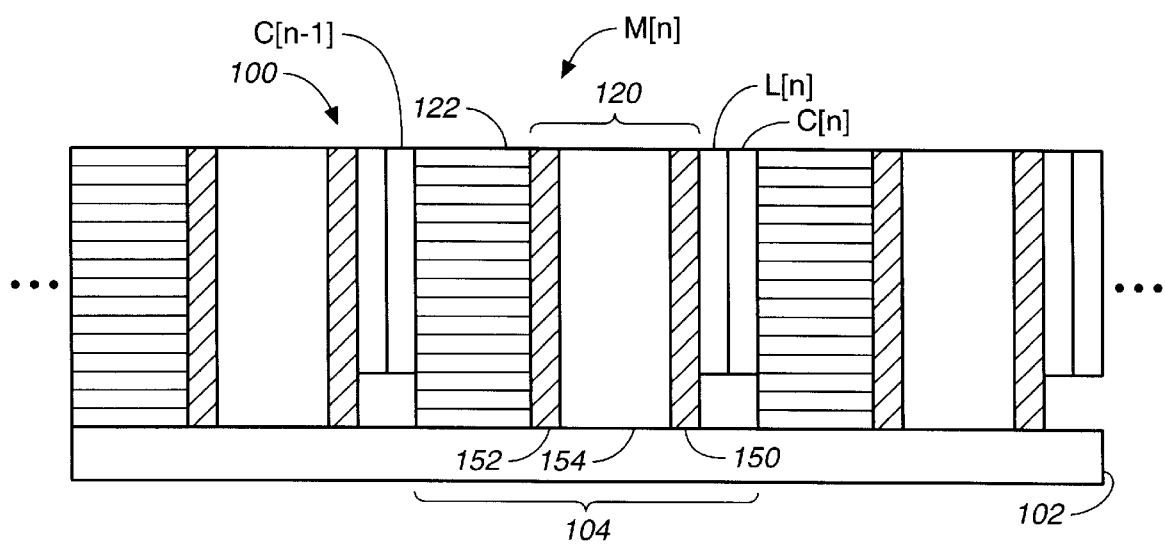
FIG._2B

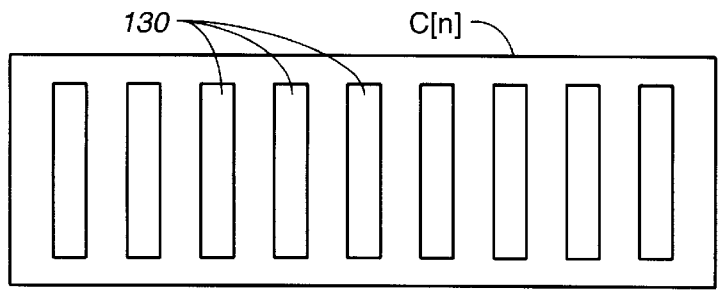
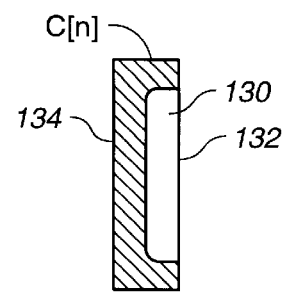
FIG._3A  FIG._3B
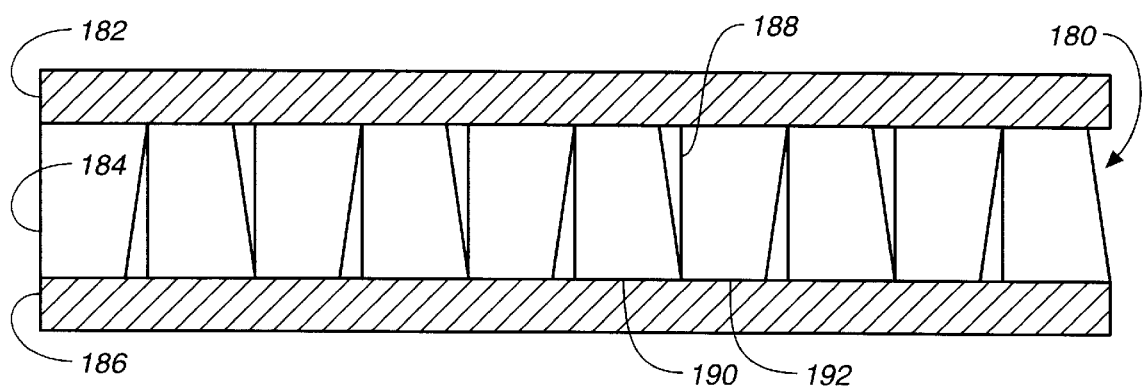
FIG._5

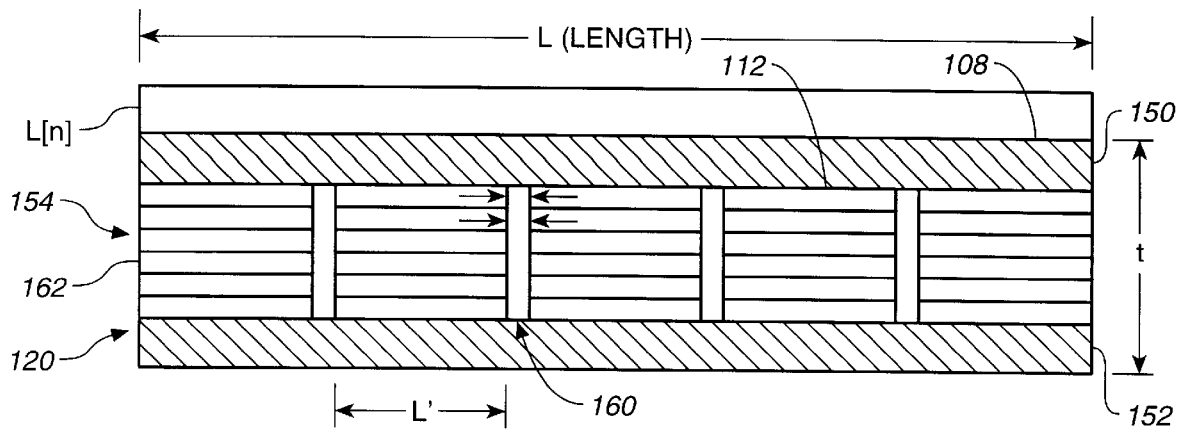
FIG._4A
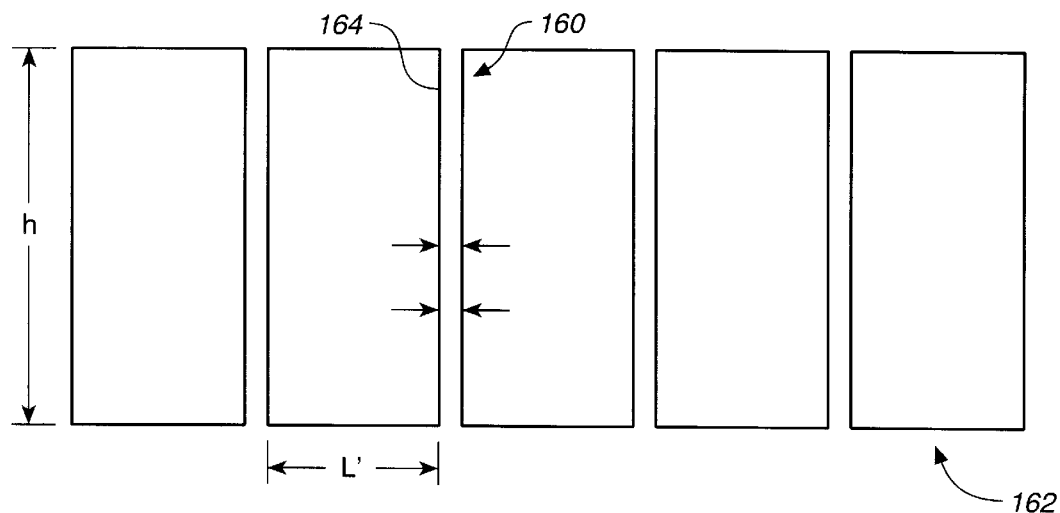
FIG._4B
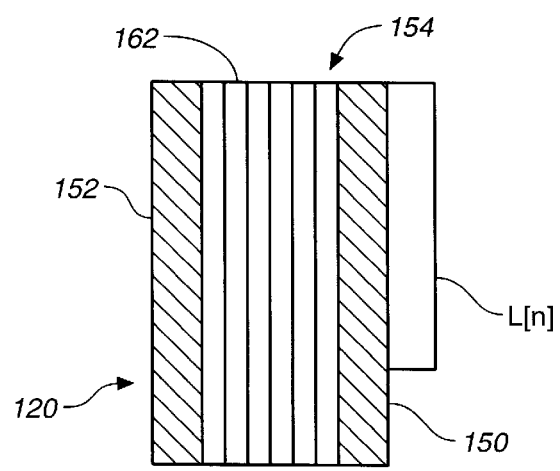
FIG._4C

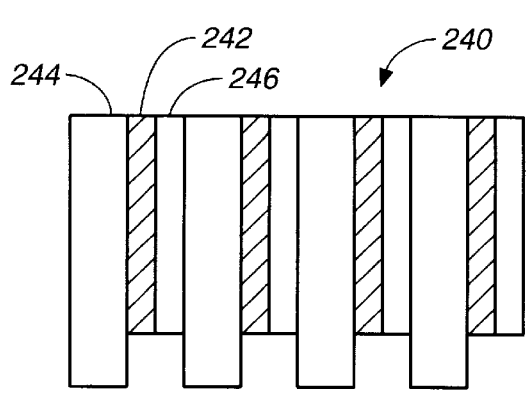
FIG._6A
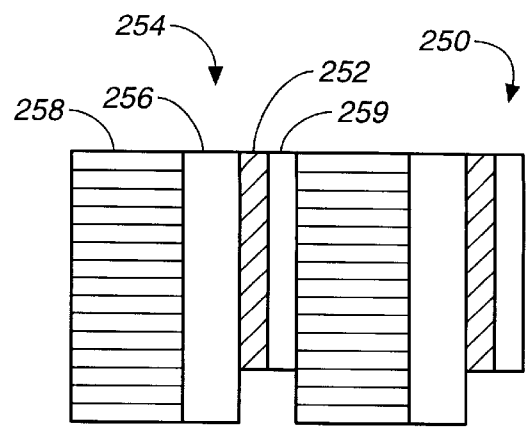
FIG._6B
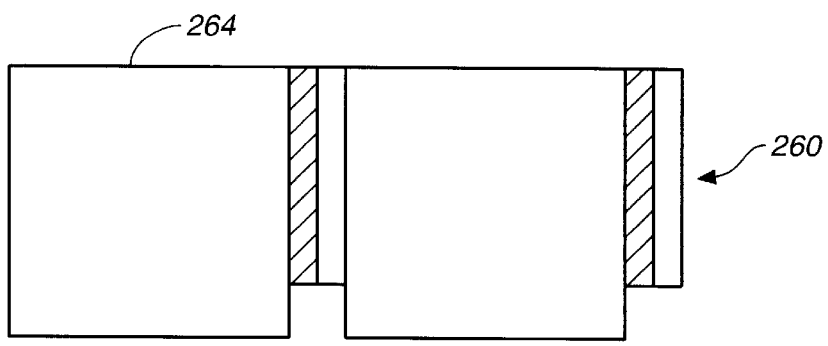
FIG._6C
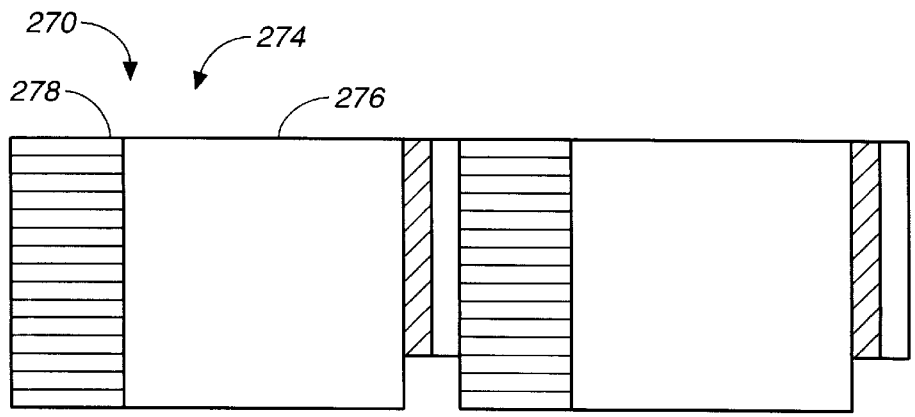
FIG._6D

5,923,692

NO WIRE BOND PLATE (NWBP) PACKAGING ARCHITECTURE FOR TWO DIMENSIONAL STACKED DIODE LASER ARRAYS

RELATED APPLICATION DATA

This application is related to co-pending U.S. patent application "Expansion-Matched High-Thermal-Conductivity Stress-Relieved Mounting Modules", Ser. No. 08/736,252, filed Oct. 24, 1996, which is assigned to the assignee of the present invention, and is herein incorporated by reference.

This invention was made with Government support under Contract No. MDA972-94-3-0020, awarded by ARPA. The Government has certain rights in this invention.

FIELD OF THE INVENTION

This invention relates to diode laser arrays. More particularly, it relates to a No Wire Bond Plate (NWBP) packaging and wiring architecture for two dimensional stacked diode laser arrays.

BACKGROUND OF THE INVENTION

High power two-dimensional diode laser arrays dissipate large amounts of power over a small spatial extent, and are simultaneously subject to stringent constraints on operating temperature. Efficient cooling of the lasers in such arrays is vital to their normal operation.

In a commonly used cooling design approach, the lasers are brought in thermal contact with a heat sink through corresponding heat-conductive submounts (mounting modules). For given heat sink and laser temperatures, the heat flow through a submount depends on the submount geometry and on the thermal properties of the submount materials. In particular, the heat flow through a module decreases with the distance between its corresponding laser and the heat sink.

At the same time, it is important that individual lasers (or monolithic linear laser arrays, also called "bars") be tested individually, or burned in, before the assembly of the two-dimensional array. Individual burning-in ensures that a defect in one array element does not require the replacement of an entire array. Burning-in an element of the 2-D array is typically done by thermally connecting the module to a test heat sink, electrically connecting the N and P sides of the bar to test leads, and running a current through the bar.

Since laser bars are very fragile, it is important to ensure that the bars are protected from mechanical stresses during testing. Such mechanical stresses arise, for example, from pressing a test lead directly on a bar. To address the testing problem stemming from the fragility of bars, a conventional array element includes a wire bond plate mounted on the module, between the bar and the base plate, for providing an electrical connection to the surface of the bar opposite the module. For more information on conventional packaging architectures for diode laser arrays, see for example U.S. Pat. No. 4,716,568. Wire leads are connected from the surface of the bar to the test leads. During testing, the test leads are pressed on the module and the wire bond plate. Thus, the laser bar is not placed in potentially-damaging mechanical contact with the test leads.

The wire bond plate also serves, after stacking, to provide an electrical communication between its corresponding bar and the module of an adjacent bar. The lasing sections of an individual bar are connected in parallel, while different bars are connected in series. The serier conductive path runs through a module, its corresponding laser, and its corresponding wire bond plate to the module of an adjacent laser.

The conventional wire-bond-plate (WBP) architecture requires relatively tall modules, and thus leads to suboptimal heat flow through the modules. The high thermal resistance of WBP modules, coupled with the relatively poor thermal conductivity of the removable connection between the module and the test heat sink, prohibit the full-power burn-in of the bars. Burn-in at low powers, in turn, requires long periods of time. No general method has been established for simultaneously reducing the distance between the laser bars and the base plate, and allowing robust testing of the bars before assembly into an array of high-power bars connected in series.

Various designs for laser diode modules are discussed in a number of U.S. Patents. For more information on conventional WBP module designs for high-power two-dimensional diode laser arrays, see for example U.S. Pat. Nos. 4,716,568 and 5,099,488, which are herein incorporated by reference.

In U.S. Pat. No. 5,495,490, Rice et al. describe a diode laser array comprising laser bars mounted on thermally conductive plates, and connected in series. Cooling fluid flows between the plates and cools the laser bars. The array described by Rice et al. does not permit individual burning-in of its elements, however. Moreover, the array is cooled by fluid, rather than by conduction of heat to a base plate. In U.S. Pat. No. 4,454,602, Smith describes a one-dimensional array of individual diode lasers wired in series. Each diode is sandwiched between two conductive plates. The distance between the diodes and the heat sink is relatively large, and the thermal conductivity of the heat-transfer assembly is poor.

OBJECTS AND ADVANTAGES OF THE INVENTION

Accordingly, it is a primary object of the present invention to provide an improved packaging architecture for a two-dimensional edge-emitting high-power diode laser array. The primary advantage of the improved architecture is that it permits a reduction in the distance between laser bars and the base plate serving as a heat sink for the bars. The improved architecture also allows a simple series connection of the laser bars, and burn-in testing that does not put mechanical stress on the laser bars. It is another object of this invention to provide an array design that allows for compensation of tolerances in the dimensions of the array elements, during stacking of the elements. It is yet another object of this invention to provide an array of laser bars displaying a reduced "smile." It is still another object of this invention to provide an array with reduced thermal resistance between its lasers and a heat sink. It is another object of this invention to provide an array having lasers which operate at a reduced temperature, for given power and duty-cycle parameters of the array. It is another object of this invention to provide an array having fewer parts, and which can be assembled in a relatively small number of steps, as compared to conventional (WBP) arrays. It is yet another object of this invention to provide a high-power, high-duty cycle array whose elements can be tested at full power prior to stacking of the elements.

SUMMARY OF THE INVENTION

These objects and advantages are attained by a diode laser array comprising a plurality of individually-testable array elements connected in series, and mounted on a thermally conducting and electrically insulating base plate. The base plate is in thermal communication with a heat sink. The array comprises a plurality of thermally conductive modules {M[n]} (n=1 . . . N, N>1) mounted on the base plate, a plurality of lasers {L[n]} mounted on the modules {M[n]}, and a plurality of electrically conductive, laser-protective caps {C[n]} mounted on the lasers {L[n]}. A laser L[n] is mounted on a module M[n], and a cap C[n] is mounted on the laser L[n] opposite module M[n], i.e. such that L[n] is situated between M[n] and C[n]. Laser L[n] is preferably a monolithic edge-emitting linear diode laser array.

A module M[n+1] is bonded to cap C[n] opposite laser L[n], i.e. such that cap C[n] is situated between L[n] and module M[n+1]. A laser L[n+1] is mounted on module M[n+1] opposite cap C[n]. Laser L[n] is in electrical communication with laser L[n+1] through cap C[n] and module M[n+1]. Laser L[n] is in thermal communication with the base plate through module M[n]. A power supply is used to apply a voltage between an end module M[1] and an end cap C[N], thereby eliciting an emission of light from lasers {L[n]}.

Module M[n] is mounted on the base plate along a base surface of module M[n], while laser L[n] is mounted on module M[n] along a mounting surface of module M[n]. The mounting surface is transverse to the base surface. Preferably, the mounting surface is substantially orthogonal to the base surface. An emitting surface of laser L[n] is transverse, preferably orthogonal, to the mounting surface.

Cap C[n] comprises a set of grooves for absorbing an excess of bonding material during a step of bonding C[n] to M[n+1]. In a preferred embodiment, the bonding material comprises an indium solder for soldering C[n] and M[n+1]. Preferably, a cap thermal expansion coefficient of cap C[n] is substantially equal to a laser thermal expansion coefficient of laser L[n]. The elements of the array are assembled by soldering. The array preferably comprises a PbSn solder between L[n] and M[n], and between L[n] and C[n].

High-duty-cycle applications require increasing the separation between adjacent laser bars, and increasing the heat flow from the bars to the base plate. In such applications, module M[n] comprises a mounting part bonded to a spacer part. Laser L[n] is mounted on the mounting part, while a cap C[n−1] is attached to the spacer part.

Module M[n] is preferably thermal-expansion-matched to L[n], and at the same time made primarily of a high-thermal-conductivity material, as explained in more detail in the above-incorporated U.S. patent application "Expansion-Matched High-Thermal-Conductivity Stress-Relieved Mounting Modules", Ser. No. 08/736,252, filed Oct. 24, 1996. Module M[n] comprises a thermally conductive mounting plate, and a thermally conductive, stress relieved bulk layer attached to the mounting plate. Laser L[n] is mounted on the mounting plate. The mounting plate is preferably expansion-matched to L[n], i.e. a plate thermal expansion coefficient of the mounting plate is substantially equal to a laser thermal expansion coefficient of L[n]. Preferably, the mounting plate and the bulk layer are electrically conductive.

The bulk layer is made of a high-thermal-conductivity material such as Cu. The bulk layer material need not be expansion-matched to L[n], and thus the choice of material is based primarily on thermal conductivity considerations. In particular, the bulk layer has a higher thermal conductivity than the mounting plate. The bulk layer has a plurality of stress-relief apertures for accommodating an expansion of the faster-expanding bulk layer along the interface between the mounting plate and the bulk layer.

Module M[n] is preferably made of thermally and electrically conductive metals or alloys. For GaAs laser bars, the mounting plate is made of a CuW composition that is expansion-matched to GaAs, and the bulk layer is made substantially of Cu. The base plate is made of BeO.

Generating light using a high-power two-dimensional edge-emitting diode laser array comprises establishing a base plate, mounting modules mounted on the base plate, laser bars mounted on the modules, and caps mounted on the lasers, and applying a voltage between an end module and an opposite end cap, thereby eliciting a light emission from the laser bars.

DESCRIPTION OF THE FIGURES

FIG. 1A is a perspective view of six elements of a prior art WBP two-dimensional diode laser array.

FIG. 1B is a side view of an element of the array of FIG. 1-A.

FIG. 2A is a perspective view of three elements of a NWBP diode laser array, according to the present invention.

FIG. 2B is a side view of the array of FIG. 2-A, according to the present invention.

FIG. 3A is a frontal view of a cap C[n] having grooves, according to the present invention.

FIG. 3B is side view of the cap of FIG. 3-A.

FIG. 4A is a top view of a mounting part with a bulk layer comprising stacked sheets, according to the present invention.

FIG. 4B is a front view of the mounting part of FIG. 4-A.

FIG. 4C is a side view of the mounting part of FIG. 4-A.

FIG. 5 is a top view of a mounting part with a bulk layer comprising blocks, according to the present invention.

FIG. 6-A shows four elements of a low-duty-cycle, closely spaced array, according to the present invention.

FIG. 6B shows two elements of a low-duty-cycle, distantly spaced array, according to the present invention.

FIG. 6C shows two elements of a high-duty-cycle, closely spaced array, according to the present invention.

FIG. 6D shows two elements of a high-duty-cycle, distantly spaced array, according to the present invention.

DETAILED DESCRIPTION

In the following discussion, for some element A, the notation A[j] is understood to correspond to some (fixed) integer j between 1 and a maximum value J, while the notation {A[j]} is understood to refer to a set of A[j] for varying values of j. The term "laser" is understood to include laser arrays, and in particular monolithic linear diode laser arrays ("bars").

FIG. 1A is a perspective view of six elements of a prior art WBP semiconductor laser diode array 20. Array 20 comprises a laser bar 30 having an emitting surface 32. Bar 30 is a one-dimensional diode laser array capable of emitting monochromatic light through parts of emitting surface 32. Bar 30 is mounted on a mounting module 34, which in turn is mounted on a thermally conducting and electrically insulating base plate 36. Base plate 36 is in thermal communication with a heat sink. A wire bond plate 38 supports wires 40 in electrical communication with bar 30, as shown in FIG. 1B. For further details on two-dimensional laser arrays similar to that shown in FIG. 1A, see for example the above-incorporated U.S. Pat. No. 4,716,568.

FIG. 1B is a side view of an element of the array of FIG. 1-A. Module 34 has a thickness t, a height h (as shown), and a length L (see FIGS. 1A and 4A). Since bar 30 dissipates a large amount of heat, it is important that module 34 conduct heat effectively from bar 30 to base plate 36, so as to maintain the temperature of bar 30 below a predetermined threshold. Bar 30 is mounted on module 34 along a mounting surface 58 of module 34. Module 34 is mounted on base plate 36 along a base surface 62 of module 34. A lens 64 is aligned with bar 34, and collects a light beam 65 emitted by bar 34.

The heat flow from bar 30 to base plate 36 is represented schematically by arrow 44. The heat flow depends on the thermal conductivity of the materials of module 34, and on the geometry of module 34. In particular, the heat flow increases with larger t and smaller h.

FIG. 2A is a perspective view of three elements of a NWBP diode laser array 100 of the present invention, while FIG. 2B is a side view of the elements of FIG. 2-A. Array 100 comprises a plurality of thermally conductive modules {M[n]}, n=1 . . . N, N>1, a plurality of diode lasers or laser arrays {L[n]}, and a plurality of electrically conductive caps {C[n]}. Modules {M[n]} are mounted on a thermally conductive base plate 102. Base plate 102 is in thermal communication with a heat sink (not shown) such as a finned structure or a metal block. Base plate 102 is thermally conducting and electrically insulating, so that it does not provide an electrical communication between different modules. In a preferred embodiment, base plate 102 is made of BeO. Other thermally conducting and electrically insulating materials are known in the art.

An element 104 of array assembly 100 comprises a module M[n], a diode laser L[n] mounted on M[n], and a cap C[n] mounted on L[n]as well as, optionally, a spacer 122. Cap C[n] is mounted on L[n] opposite M[n], i.e. such that L[n] is situated between M[n] and C[n]. Laser L[n] is in thermal communication with base plate 102 through module M[n]. A module M[n+1] is bonded to C[n] opposite L[n], i.e. such that C[n] is situated between L[n] and M[n+1]. A laser L[n+1] is mounted on M[n+1] opposite cap C[n], and a cap C[n+1] is mounted on L[n+1]. Lasers {L[n]} are connected in series. An electrical communication is established between L[n] and L[n+1], through C[n] and M[n+1]. Electrical communications are preferably established through the volumes of modules {M[n]}.

Module M[n] is mounted on base plate 102 along a base surface 106 of module M[n], while laser L[n] is mounted on module M[n] along a mounting surface 108 of module M[n]. Mounting surface 108 is transverse, and preferably orthogonal, to base surface 106. An emitting surface 110 of laser L[n] is transverse to mounting surface 108.

Module M[n] generally comprises a mounting part 120 bonded to a spacer part 122 by a high-thermal-conductivity bond. Laser L[n] is mounted on mounting part 120, while a cap C[n−1] is attached to spacer part 122. Mounting part 120 is expansion-matched to laser L[n], at least along mounting surface 108.

Element 104 is preferably assembled in a single fixtured processing step, in which laser L[n] is simultaneously PbSn-soldered between module M[n] and cap C[n]. Module M[n] and cap C[n] are evaporated with a thin, flat layer of PbSn solder on a metallization pad. Laser L[n] is pressed flat between module M[n] and cap C[n] with a light, uniform force, and the PbSn solder is heated to reflow. The process does not require pushing laser L[n] into molten solder using a vacuum collet, and thus reduces the chance of damaging laser L[n]. Following its assembly, element 104 is burned-in by applying test leads to module M[n] and cap C[n], and running a current through L[n].

Base plate 102 is soldered to a cooler prior to the attachment of the elements of array assembly 100. A stripe pattern corresponding to the mounting positions of the elements is evaporated onto the surface of base plate 102. The elements are stacked and cold-pressed every few elements to remove variations in element spacings. The element assembly is reflowed (fluxless) without pressure; the lack of pressure eliminates solder balls, which produce shorted and optically obstructed elements. The element assembly is pressed onto the stripe pattern of base plate 102. The solder between the element assembly and base plate 102 is reflowed without pressure, and electrical contacts are made to array assembly 100.

FIG. 3A shows a frontal view of cap C[n], orthogonal to the view of FIG. 2B. Cap C[n] has a plurality of grooves 130 for absorbing an excess of In solder between cap C[n] and module M[n+1]. FIG. 3B shows a side view of cap C[n]. Preferably, grooves 130 have openings on the surface 132 of cap C[n] adjacent to module M[n+1], but not on the surface 134 of cap C[n] adjacent to laser L[n], as illustrated in FIG. 3B. Alternatively, grooves 130 are channels running through the entire thickness of cap C[n] (not shown). Cap C[n] serves to protect laser array L[n] during the burn-in of element 104, to absorb tolerances in the thickness of element 104, and as a spacer during the stacking of the elements of array assembly 100. The role of cap C[n] as a spacer reduces the incidence of shorting across laser L[n].

Cap C[n] is preferably thermal-expansion-matched to laser L[n]. In particular, a cap thermal expansion coefficient of C[n] is substantially equal to a laser thermal expansion coefficient of L[n]. For a GaAs laser L[n], cap C[n] preferably comprises a layer of CuW, or a Cu—Mo laminate with the Cu and Mo thicknesses chosen such that cap C[n] is expansion-matched to GaAs.

Preferably, mounting part 120 is thermal-expansion-matched to laser L[n], and at the same time has a high thermal conductivity, as described in more detail in the above-incorporated U.S. patent application "Expansion-Matched High-Thermal-Conductivity Stress-Relieved Laser Diode Modules", Ser. No. 08/736,252, filed Oct. 24, 1996. As shown in FIGS. 2B and 4A, mounting part 120 comprising a thermally conductive mounting plate 150, an auxiliary plate 152, and a bulk layer 154 is bonded to, and situated between, plates 150 and 152. Auxiliary plate 152 bonded to bulk layer 154 opposite mounting plate 150.

A plate thermal expansion coefficient of mounting plate 150 is substantially equal to a laser thermal expansion coefficient of laser L[n]. A bulk layer thermal conductivity of bulk layer 154 is higher than a mounting plate thermal conductivity of mounting plate 108. For a GaAs laser L[n], it is preferred that mounting plate 108 be made substantially of a Cu—W composition that is expansion-matched to GaAs, and that bulk layer 154 be made substantially of Cu. Mounting plate 150, bulk layer 154, and auxiliary plate 152 are preferably Ag—Cu-brazed at 800° C.

Referring particularly to FIG. 4A, bulk layer 15, has a set of stress-relief apertures 160 for accommodating the expansion of bulk layer 154 along one of its major dimensions (as shown, its length), as illustrated by the horizontal arrows in FIG. 4-A. Apertures 160 are transverse to mounting surface 108 so as not to impede the heat flow from laser L[n], transverse to mounting surface 108. Preferably, apertures 160 are channels substantially perpendicular to mounting surface 108. It is further preferred that the cumulative width of apertures 160 constitute only a small fraction of the length L of mounting part 120, so that heat flow transverse to mounting surface 108 is not significantly obstructed.

Since it may be difficult to define thin apertures 160 through an entire thick bulk layer 154, bulk layer is preferably assembled from stacked sheets 162. FIG. 4B shows a front view of a sheet 162, orthogonal to the view of FIG. 4A. Aperture parts 164 are defined in sheet 162 prior to the assembly of bulk layer 154. A set of stacked aperture parts 164 from different sheets define an aperture 160. The thicknesses of sheets 162 are of the same order of magnitude as the widths of aperture parts 164, since machining or etching aperture parts 164 is difficult for relatively thick sheets. FIG. 4C is a side view of mounting part 120.

In an alternative embodiment, the bulk layer is assembled from blocks rather than stacked sheets. FIG. 5 shows a mounting part 180 comprising a mounting plate 182, a bulk layer 184, and an auxiliary plate 186. A stress relief aperture 188 is defined between a block 190 and a block 192 adjacent to block 190. Bulk layer 184 can be assembled from identical blocks.

The thickness of module M[n] depends on the average amount of power dissipated by lasers {L[n]}, and on the desired spacing between adjacent lasers. If lasers {L[n]} are operated at a high duty cycle, a relatively thick module is required. Conversely, operation of laser L[n] at a low duty cycle results in a lower average amount of dissipated heat, and allows a thinner module. In one embodiment, module M[n] does not utilize a spacing part such as spacer part 122.

FIG. 6A shows four elements of an array assembly 240 designed for low-duty-cycle operation, and having closely spaced lasers or laser arrays 242. Modules 244 are the only mounting parts. Caps 246 are mounted on laser arrays 242. FIG. 6B shows two elements of an array assembly 250 designed for low-duty-cycle operation, and having lasers or laser arrays 252 spaced relatively far apart employing spacers 258 of modules 254. Modules 254 each comprise mounting part or submount 256 and spacing part or spacer 258. Caps 259 are mounted on laser arrays 252. FIGS. 6C and 6D illustrate modules designed for high-duty-cycle laser operation. A closely-spaced, high-duty-cycle laser array 260 comprises high-duty modules 264, which include only thick mounting parts, while a distantly-spaced, high-duty-cycle laser array 270 comprises high-duty modules 274, which include mounting parts or submounts 276 and spacing parts spacer 278.

It will be clear to one skilled in the art that the above embodiment may be altered in many ways without departing from the scope of the invention. Accordingly, the scope of the invention should be determined by the following claims and their legal equivalents.

What is claimed is:

1. A diode laser array comprising:
    a) a thermally conducting base plate;
    b) a plurality of thermally conductive mounting modules {M[n]} mounted on said base plate, n=1 ... N, N>1, said modules {M[n]} comprising a bulk layer;
    c) stress-relief means formed in said bulk layer;
    d) a plurality of diode lasers {L[n]}; a laser L[n] being mounted on a module M[n]; and
    e) a plurality of electrically conductive caps {C[n]}, a cap C[n] being mounted on said laser L[n] opposite said module M[n], a module M[n+1] being bonded to said cap C[n] opposite said laser L[n]; wherein said laser L[n] is in electrical communication with a laser L[n+1] mounted on said module M[n+1] through said cap C[n] said module M{n+1}, and said laser L[n] is in thermal communication with said bass plate through said module M[n].

2. The array of claim 1 wherein said laser L[n+1] is mounted on said module M[n+1] opposite said cap C[n].

3. The array of claim 1 wherein:
    a) said module M[n] is mounted on said base plate along a base surface of said module M[n];
    b) said laser L[n] is mounted on said module M[n] along a mounting surface of said module M[n]; and
    c) said mounting surface is transverse to said base surface.

4. The array of claim 3 wherein an emitting surface of said laser L[n] is transverse to said mounting surface.

5. The array of claim 1 wherein said cap C[n] has a plurality of grooves for absorbing an excess of a bonding material between said cap C[n] to said module M[n+1].

6. The array of claim 5 wherein said bonding material comprises a solder.

7. The array of claim 6 wherein said solder comprises In.

8. The array of claim 1 wherein a cap thermal expansion coefficient of said cap C[n] is substantially equal to a laser thermal expansion coefficient of said laser L[n].

9. The array of claim 1 further comprising a solder between said laser L[n] and said module M[n], and between said laser L[n] and said cap C[n].

10. The array of claim 9 wherein said solder comprises Pb and Sn.

11. The array of claim 1 wherein:
    a) said module M[n] comprises a mounting part bonded to a spacer part;
    b) said laser L[n] is mounted on said mounting part; and
    c) a cap C[n-1] is attached to said spacer part.

12. The array of claim 1 wherein:
    a) said module M[n] further comprises a thermally conductive mounting plate, said bulk layer attached to said mounting plate;
    b) said laser L[n] is mounted on said mounting plate.

13. The array of claim 12 wherein a plate thermal expansion coefficient of said mounting plate is substantially equal to a laser thermal expansion coefficient of said laser L[n].

14. The array of claim 12 wherein said bulk layer comprises Cu.

15. The array of claim 14 wherein:
    a) said laser L[n] comprises GaAs; and

16. The array of claim 1 wherein said stress-relief means comprises a plurality of stress-relief apertures for accommodating an expansion of said bulk layer relative to said module mounted laser.

17. The array of claim 16 wherein said bulk layer comprises a plurality of stacked sheets.

18. The array of claim 16 wherein said bulk layer comprises a of blocks.

19. The array of claim 1 wherein said module M[n] comprises a thermally and electrically conductive metal.
    b) said mounting plate comprises Cu and W.

20. The array of claim 1 wherein said laser L[n] comprises a monolithic edge-emitting linear diode laser array.

21. The array of claim 1 further comprising a power supply for applying a voltage between a module M[1] and a cap C[N], thereby eliciting an emission of light from said plurality of diode lasers {L[n]}.

22. The array of claim 1 wherein said bulk layer comprises a plurality of stacked sheets.

23. The array of claim 1 wherein said bulk layer comprises a plurality of blocks.

24. The array of claim 1 wherein said bulk layer comprises a material that has a high thermal conductivity than said module mounted laser.

25. A packaging architecture for two dimensional stacked laser array assembly comprising:
- a plurality of laser arrays having opposite major surfaces;
- thermally conductive modules each having opposite major surfaces and a second side surface transverse to said major surfaces;
- said modules and said laser arrays sequentially stacked in series so that a module between adjacent laser arrays has its major surfaces in thermal engagement with a major surface of adjacent laser arrays;
- said modules having a first portion including one of said module major surfaces which is in thermal engagement with a laser array;
- said first portion thermally expansion matched to the laser array;
- said modules having a second portion in thermal engagement with said first portion, said second portion having a higher thermal conductivity than said first portion of said modules; and
- thermal stress-relief formed in said second portion for accommodating expansion of said modules relative to said laser arrays.

26. The packaging architecture of claim 25 wherein the thickness of the modules between opposite major surfaces is determined by both the amount heat dissipation desired for the laser arrays to the heat sink and desired spacing between the laser arrays.

27. The packaging architecture of claim 25 wherein said thermal stress-relief comprises a bulk layer having a plurality of stress-relief apertures formed in said bulk layer for accommodating its thermal expansion relative to said laser arrays.

28. The packaging architecture of claim 27 wherein said apertures extend in a direction transverse to the planar extent of said module major surfaces.

29. The packaging architecture of claim 27 wherein said bulk layer is a plurality of stacked sheets.

30. The packaging architecture of claim 27 wherein said bulk layer is a plurality of blocks.

31. The packaging architecture of claim 25 wherein said apertures relieve stress in a direction substantially transverse to the direction of stacked laser array.

32. The packaging architecture of claim 25 wherein
- each of said laser arrays have one of its major surfaces in thermal and electrical communication with a major surface of a corresponding module to provide a first electrical contact for in-series electrical coupling of said laser arrays and to provide a thermal heatsink contact via a side surface of the said module to a heatsink; and
- means on the other major surface of each of said laser arrays thermal expansion matched to the laser array to provide a second electrical contact for electrical coupling between the laser array and a next adjacent thermally conductive module, provided that the laser array in such communication is not the last such laser array in the stacked assembly.

33. The packaging architecture of claim 32 wherein said second electrical contact means is a cap.

34. The packaging architecture of claim 33 wherein said cap has a series of grooves formed in or slots formed therethrough.

35. The packaging architecture of claim 32 further comprising a spacer positioned between each electrically coupled second electrical contact means and said module to provide for a larger spacing between the laser arrays accorded by additional thickness of the spacer.

36. The packaging architecture of claim 25 wherein said module second portion comprises a plurality of stacked sheets.

37. The packaging architecture of claim 25 wherein said module second portion comprises a plurality of blocks.

38. A packaging architecture for two dimensional stacked laser array assembly comprising:
- a plurality of laser arrays having opposite major surfaces;
- thermally conductive modules having opposite major surfaces, said modules having a higher thermal conductivity than said laser arrays;
- said modules and said laser arrays linearly stacked in series so that a module between adjacent laser arrays has its major surfaces in thermal engagement with a major surface of adjacent laser arrays; and
- thermal stress-relief formed in said modules for accommodating expansion of said modules relative to said laser arrays.

39. The packaging architecture of claim 38 wherein each of said laser arrays having one of its major surfaces in thermal and electrical communication with a major surface of a corresponding module to provide a first electrical contact for in-series electrical coupling of said laser arrays and to provide a thermal heatsink contact via said module to a heatsink.

40. The packaging architecture of claim 39 further comprising means on another major surface of each of said laser arrays thermal expansion matched to the laser array and to provide a second electrical contact for electrical coupling between the laser array and a next adjacent thermally conductive module, provided that the laser array in such communication is not the last such laser array in the stacked assembly.

41. The packaging architecture of claim 40 wherein said second electrical contact means is a cap.

42. The packaging architecture of claim 41 wherein said cap has a series of grooves formed in or slots formed therethrough.

43. The packaging architecture of claim 40 further comprising a spacer positioned between each electrically coupled second electrical contact means and said module to provide for a larger spacing between the laser arrays accorded by additional thickness of the spacer.

44. The packaging architecture of claim 38 wherein the thickness of said modules between opposite major surfaces is determined by both the amount heat dissipation desired for the laser arrays to the heat sink and desired spacing between the laser arrays.

45. The packaging architecture of claim 38 wherein said thermal stress-relief comprises a plurality of stress-relief apertures formed in said modules for accommodating its thermal expansion.

46. The packaging architecture of claim 45 wherein said apertures extend in a direction transverse to the planar extent of said module major surfaces.

47. The packaging architecture of claim 45 wherein said modules comprise a plurality of stacked sheets.

48. The packaging architecture of claim 45 wherein said modules comprise a plurality of blocks.

49. The packaging architecture of claim 45 wherein said apertures relieve stress in a direction substantially transverse to the direction of stacked laser array.

50. The packaging architecture of claim 38 wherein said modules comprise a plurality of stacked sheets.

51. The packaging architecture of claim 38 wherein said modules comprise a plurality of blocks.

52. The packaging architecture of claim 38 wherein each of said modules have a first portion thermally expansion matched to said laser arrays and in thermal engagement with one of said laser arrays and a second portion that includes said thermal stress-relief and in thermal engagement with said first portion, said second portion having a higher thermal conductivity that said first portion.

53. The packaging architecture of claim 52 wherein said first portion comprises a mounting plate for said laser array.

54. The packaging architecture of claim 52 wherein said second portion comprises a bulk layer.

55. The packaging architecture of claim 54 wherein said bulk layer comprises a plurality of stacked sheets or a plurality of blocks.

* * * * *